US009660186B2

United States Patent
Bae et al.

(10) Patent No.: US 9,660,186 B2
(45) Date of Patent: May 23, 2017

(54) METHOD OF INSPECTING BY-PRODUCTS AND METHOD OF MANUFACTURING SEMICONDUCTOR DEVICE USING THE SAME

(71) Applicant: Samsung ELectronics Co., Ltd., Suwon-si, Gyeonggi-do (KR)

(72) Inventors: Jinhye Bae, Suwon-si (KR); Wonjun Lee, Seoul (KR); Yoonsung Han, Seoul (KR); Hoon Han, Anyang-si (KR); Kyu-Man Hwang, Hwaseong-si (KR); Yongsun Ko, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/175,463

(22) Filed: Jun. 7, 2016

(65) Prior Publication Data

US 2017/0104152 A1    Apr. 13, 2017

(30) Foreign Application Priority Data

Oct. 7, 2015    (KR) .......................... 10-2015-0140974

(51) Int. Cl.

| H01L 21/00 | (2006.01) |
| H01L 43/12 | (2006.01) |
| H01L 43/02 | (2006.01) |
| H01L 43/08 | (2006.01) |
| H01L 43/10 | (2006.01) |
| H01L 21/66 | (2006.01) |

(52) U.S. Cl.
CPC .............. *H01L 43/12* (2013.01); *H01L 22/12* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

| 6,893,893 | B2 * | 5/2005 | Nallan | ................. H01L 23/564 |
| | | | | 257/E23.002 |
| 7,955,870 | B2 | 6/2011 | Ditizio | |
| 8,435,885 | B2 | 5/2013 | Chumakov et al. | |
| 8,491,799 | B2 | 7/2013 | Jung | |
| 9,029,964 | B2 | 5/2015 | Ha et al. | |
| 9,515,255 | B2 * | 12/2016 | Park | ........................ H01L 43/12 |
| 2004/0043620 | A1 * | 3/2004 | Ying | ...................... B82Y 25/00 |
| | | | | 438/710 |

(Continued)

FOREIGN PATENT DOCUMENTS

| KR | 20030078136 A | 10/2003 |
| KR | 20030088572 A | 11/2003 |

(Continued)

*Primary Examiner* — David E Graybill
(74) *Attorney, Agent, or Firm* — Ward and Smith, P.A.

(57) ABSTRACT

Provided is a method of manufacturing a semiconductor device. The method of manufacturing the semiconductor device includes forming magneto tunnel layers, forming a hard mask on the magneto tunnel layers, etching the magneto tunnel layers to form a magneto tunnel junction, wherein etching by-products are formed on sidewalls of the magneto tunnel junction, performing chemical treatment on the etching by-products to convert the etching by-products into a chemical reactant; and inspecting the chemical reactant.

20 Claims, 13 Drawing Sheets

(56) References Cited

U.S. PATENT DOCUMENTS

| | | | |
|---|---|---|---|
| 2009/0159562 A1* | 6/2009 | Cho | H01L 43/12 |
| | | | 216/22 |
| 2015/0061134 A1* | 3/2015 | Lee | H01L 21/764 |
| | | | 257/751 |
| 2015/0249204 A1* | 9/2015 | Ha | H01L 43/02 |
| | | | 257/421 |
| 2016/0163591 A1* | 6/2016 | Ishizaka | H01L 21/2855 |
| | | | 438/643 |

FOREIGN PATENT DOCUMENTS

| | | |
|---|---|---|
| KR | 100546116 B1 | 1/2006 |
| KR | 100763732 B1 | 10/2007 |
| KR | 100801731 B1 | 2/2008 |
| KR | 20100053856 A | 5/2010 |
| KR | 20120017317 A | 2/2012 |
| KR | 20130099450 A | 9/2013 |

* cited by examiner

METHOD OF INSPECTING BY-PRODUCTS AND METHOD OF MANUFACTURING SEMICONDUCTOR DEVICE USING THE SAME

CROSS-REFERENCE TO RELATED APPLICATION

This application claims priority under 35 U.S.C. §119 to Korean Patent Application No. 10-2015-0140974, filed on Oct. 7, 2015, the disclosure of which is hereby incorporated by reference in its entirety.

BACKGROUND

Field

Embodiments of the inventive concept relate to a method of inspecting etching by-products in a process of manufacturing a semiconductor device, and a method of performing a process of manufacturing a semiconductor device by setting, correcting, and revising process conditions based on the inspected etching by-products.

Description of Related Art

A semiconductor device is manufactured through various processes. For example, a magneto tunnel junction (MTJ) of a magneto-resistive random access memory (MRAM) is formed by a physical etching process such as an ion beam sputtering process, and/or the like. By-products including metallic materials remain on side surfaces of the MTJ as a result of the etching process, causing a malfunction of the MRAM device. Thus, a process of inspecting and analyzing the etching by-products is required. Although the etching by-products may be analyzed using an electron microscope, the etching by-products cannot be easily inspected optically, and thus, a more complex inspecting process is required, which results in degraded productivity in the manufacturing process.

SUMMARY

Embodiments of the inventive concept provide a method of rapidly optically inspecting and analyzing etching by-products including a metal.

Other embodiments of the inventive concept provide a method of increasing productivity of a process of manufacturing a semiconductor device by inspecting and analyzing etching by-products.

Other embodiments of the inventive concept provide a method of performing a process of manufacturing a semiconductor device by setting, correcting, and compensating process conditions by inspecting and analyzing etching by-products.

The technical objectives of the inventive concept are not limited to the above disclosure, and other objectives may become apparent to those of ordinary skill in the art based on the following descriptions.

In accordance with an aspect of the inventive concept, a method of manufacturing a semiconductor device includes forming magneto tunnel layers; forming a hard mask on the magneto tunnel layers; etching the magneto tunnel layers to form a magneto tunnel junction; performing a chemical treatment on a specimen for inspection from the magneto tunnel junction to convert the etching by-products formed on sidewalls of the specimen into a chemical reactant; and inspecting the chemical reactant.

In accordance with another aspect of the inventive concept, a method of manufacturing a semiconductor device includes forming an insulating layer on a substrate; forming a magneto tunnel junction and a hard mask on the insulating layer; performing a chemical treatment on a specimen for inspection from the magneto tunnel junction to convert etching by-products formed on sidewalls of the specimen into a chemical reactant; and inspecting the chemical reactant and correcting conditions of a process for forming the magneto tunnel junction.

In accordance with still another embodiment of the inventive concept, a method of manufacturing a semiconductor device includes forming a target material layer on a lower interlayer insulating layer; forming a hard mask including one of tungsten (W) and titanium nitride (TiN) on the target material layer; etching the target material layer to form a pattern; wet oxidizing etching by-products mainly including tungsten (W) or titanium (Ti) formed on sidewalls of the pattern to convert the etching by-products into tungsten oxide ($WO_x$) or titanium oxide ($TiO_3$); inspecting the tungsten oxide ($WO_x$) or the titanium oxide ($TiO_3$) using an electron microscope; and dry oxidizing the etching by-products.

In accordance with still another embodiment of the inventive concept, provided is a method of forming a magneto tunnel junction for a semiconductor device comprising: forming magneto tunnel layers on an insulating layer formed on a substrate; forming a hard mask on the magneto tunnel layers; etching the magneto tunnel layers to form a magneto tunnel junction; performing a chemical treatment on a specimen for inspection from the magneto tunnel junction to convert the etching by-products formed on sidewalls of the specimen for inspection into a chemical reactant; inspecting the chemical reactant, and removing etching by-products formed on sidewalls of the magneto tunnel junction and the hard mask based on the inspecting of the chemical reactant.

In accordance with yet another aspect, embodiments of the inventive concept may include semiconductor devices manufactured according to the methods as set forth herein.

Detailed description of other embodiments of the inventive concept are included in detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
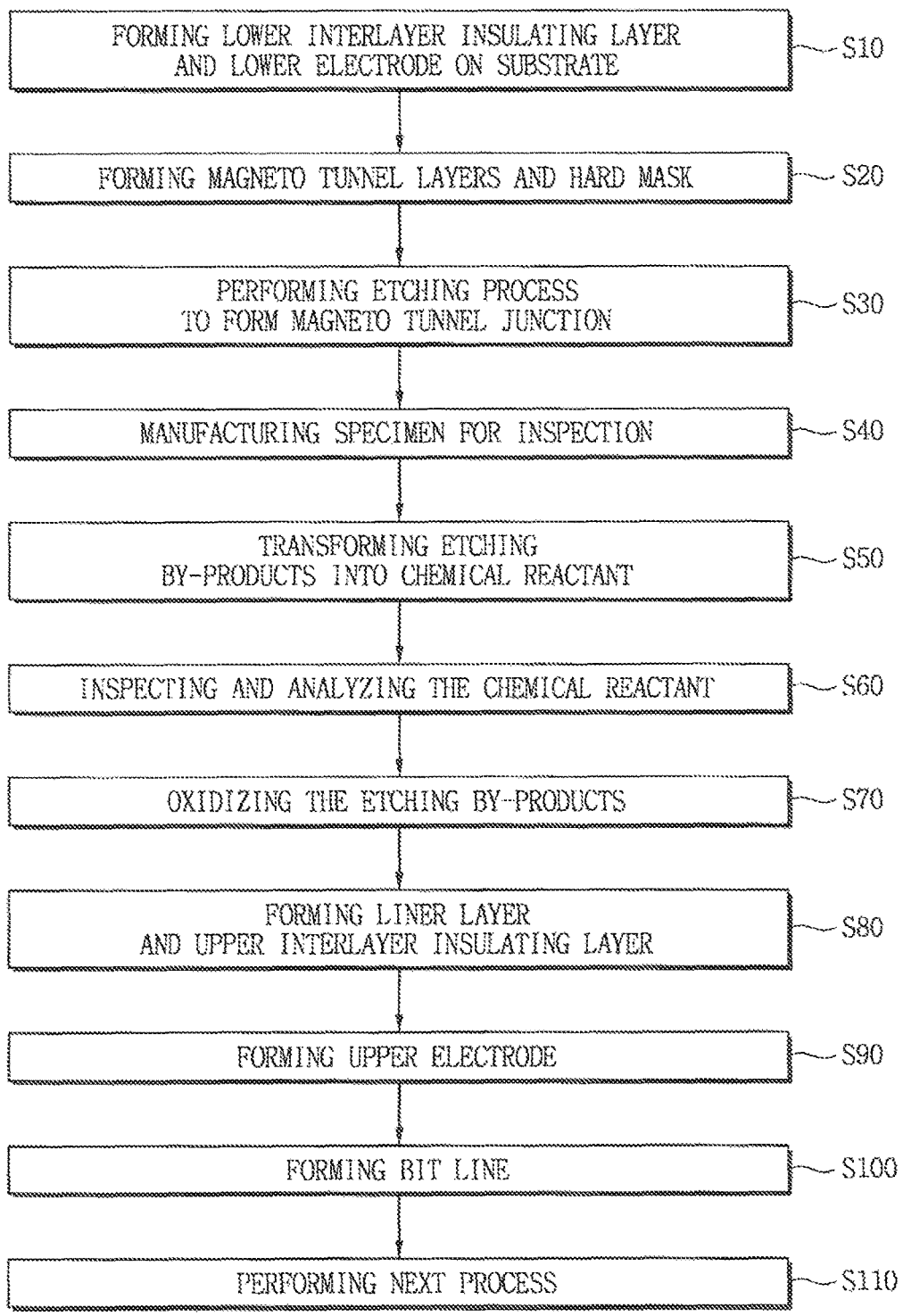
FIG. 1 is a flowchart illustrating a method of manufacturing a semiconductor device in accordance with an embodiment of the inventive concept.

Exemplary embodiments of the present invention will now be described more fully with reference to the accompanying drawings to clarify aspects, features, and advantages of the present invention. The invention may, however, be embodied in many different forms and should not be construed as being limited to the embodiments set forth herein. Rather, these embodiments are provided so that this disclosure will be through and complete, and will fully convey the concept of the invention to those of ordinary skill in the art. The present invention is defined by the appended claims.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein should be interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from the implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device, and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly defined so herein.

FIG. 1 is a flow chart illustrating a method of manufacturing a semiconductor device in accordance with an embodiment of the inventive concept, and FIGS. 2A to 2H are longitudinal cross-sectional views illustrating the semiconductor device for schematically describing a method of manufacturing a semiconductor device in accordance with an embodiment of the inventive concept.

Figure 2A:
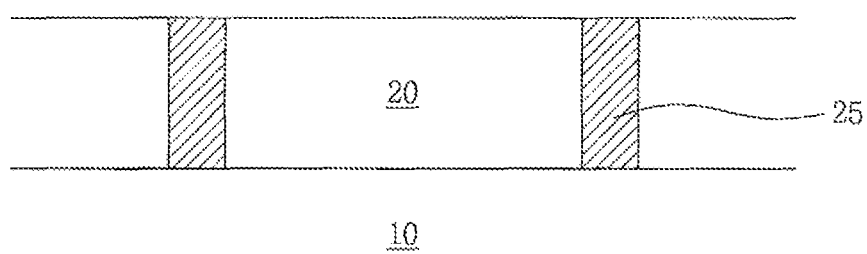
FIGS. 2A to 2H are longitudinal cross-sectional views illustrating a semiconductor device for schematically describing a method of manufacturing a semiconductor device in accordance with an embodiment of the inventive concept.

Referring to FIGS. 1 and 2A, the method of manufacturing the semiconductor device in accordance with the embodiment of the inventive concept may include forming a lower interlayer insulating layer 20 on a substrate 10, and forming a lower electrode 25 configured to pass through the lower interlayer insulating layer 20 and connected to the substrate 10 (S10). The substrate 10 may include a silicon wafer, a silicon on insulator (SOI) wafer, or a semiconductor wafer including an epitaxial growth layer such as an SiGe layer. The lower interlayer insulating layer 20 may include a silicon oxide such as tetraethylorthosilicate (TEOS) or a high density plasma (HDP) oxide. The lower electrode 25 may include a conductor such as at least one of polysilicon, a metal, a metal alloy, or a metal silicide. The method may include performing a planarization process such as a CMP process to planarize, and thus, upper surfaces of the lower interlayer insulating layer 20 and the lower electrode 25 may be coplanar.

Figure 2B:
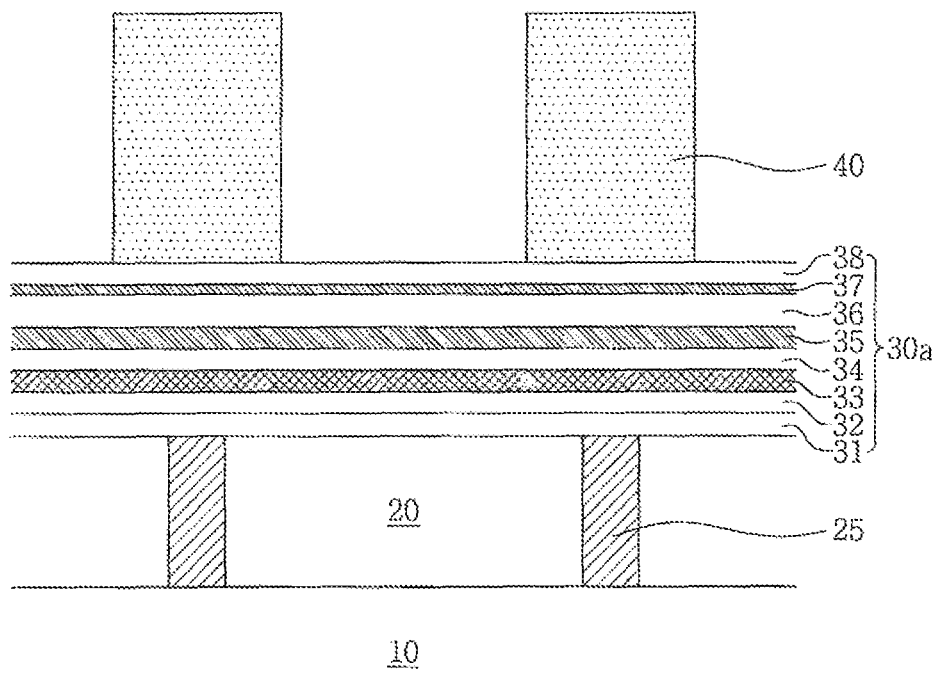

Referring to FIGS. 1 and 2B, the method may include forming magneto tunnel layers 30*a*, which are etching target material layers, and a hard mask 40, on the lower interlayer insulating layer 20 and the lower electrode 25 (S20). The magneto tunnel layers 30*a* may include a seed layer 31, a lower fixed magneto layer 32, a synthetic anti-ferromagnetic (SAF) layer 33, an upper fixed magneto layer 34, a lower tunneling barrier layer 35, a free layer 36, an upper tunneling barrier layer 37, and a capping layer 38. The seed layer 31 may include at least one of tantalum (Ta), titanium (Ti), ruthenium (Ru), or a combination thereof. For example, the seed layer 31 may include a single layer or a double layer including at least one among a tantalum (Ta) layer, a titanium (Ti) layer, or a ruthenium (Ru) layer. For example, the seed layer 31 may be formed by a single layer or double layer including at least one of the tantalum (Ta) layer or the titanium (Ti) layer, or the ruthenium (Ru) layer. For example, the seed layer 31 may be formed by a double layer including one of the tantalum (Ta) layer or the titanium (Ti) layer, and the ruthenium (Ru) layer. The lower fixed magneto layer 32 may include any one of a cobalt-platinum (CoPt) layer, a cobalt-palladium (CoPd) layer, an alloy layer including cobalt-platinum (CoPt) and cobalt-palladium (CoPd), or a layer in which a cobalt/platinum (Co/Pt) layer and a cobalt/palladium (Co/Pd) layer are stacked alternately. The SAF layer 33 may include any one of anti-ferromagnetic metals such as ruthenium (Ru), iridium (Ir), rhenium (Re), or osmium (Os). The upper fixed magneto layer 34 may include a cobalt-iron (CoFe) based material. For example, the upper fixed magneto layer 34 may include cobalt-iron-boron (CoFeB). In some embodiments, the upper fixed magneto layer 34 may include a multi-layer of a cobalt-iron-boron (CoFeB) layer, a tantalum (Ta) layer, or a cobalt-iron-boron (CoFeB) layer. In some embodiments, the upper fixed magneto layer 34 may include a multi-layer of a cobalt (Co) layer, a boron (B) layer, or a cobalt-iron-boron (CoFeB) layer, i.e., Co/B/CoFeB, or a cobalt (Co) layer, a tungsten (W) layer, a cobalt-iron-boron (CoFeB) layer, a tungsten (W) layer, or a cobalt-iron-boron (CoFeB) layer, i.e., Co/W/CoFeB/W/CoFeB. The lower tunneling barrier layer 35 may include magnesium oxide (MgO). The free layer 36 may include any one of a single cobalt-iron-boron (CoFeB) layer or a multi-layer of a cobalt-iron-boron (CoFeB) layer, a tungsten (W) layer, and a cobalt-iron-boron (CoFeB) layer. The upper tunneling barrier layer 37 may include any one of magnesium oxide (MgO), tantalum oxide (TaO), titanium oxide (TiO), barium oxide (BaO), zirconium oxide (ZrO), aluminum oxide (AlO), strontium oxide (SrO), hafnium oxide (HfO), lanthanum oxide (LaO), cerium oxide (CeO), samarium oxide (SmO), thorium oxide (ThO), calcium oxide (CaO), scandium oxide (ScO), yttrium oxide (YO), chrome oxide (CrO), tungsten oxide (WO), or other metal oxides. In some embodiments, the upper tunneling barrier layer 37 may be omitted. The capping layer 38 may include any one of metals such as ruthenium (Ru), iridium (Ir), tantalum (Ta), titanium (Ti), tantalum nitride (TaN), and titanium nitride (TiN), or a conductive metal compound. The hard mask 40 may include any one of a metal or a metal nitride. For example, the hard mask 40 may include any one of tungsten (W), ruthenium (Ru), iridium (Ir), tungsten nitride (WN), tantalum nitride (TaN), or titanium nitride (TiN). In the embodiments, the hard mask 40 is assumed and described to include any one of tungsten (W) and titanium nitride (TiN). The seed layer 31, the lower fixed magneto layer 32, the SAF layer 33, the upper fixed magneto layer 34, the free layer 36, the capping layer 38, and the hard mask 40 may be formed through a physical vapor deposition (PVD) process such as a sputtering process. In some embodiments, the upper fixed magneto layer 34 may be formed using a metallic organic chemical vapor deposition (MOCVD) process. The lower tunneling barrier layer 35 and the upper tunneling barrier layer 37 may be formed by forming a magnesium (Mg) layer or a tantalum (Ta) layer using a PVD process such as sputtering, and then oxidizing the magnesium (Mg) layer or the tantalum (Ta) layer. In some embodiments, the upper tunneling barrier layer 37 may be formed by forming any one of the above-described metals and then oxidizing the metals.

Figure 2C:
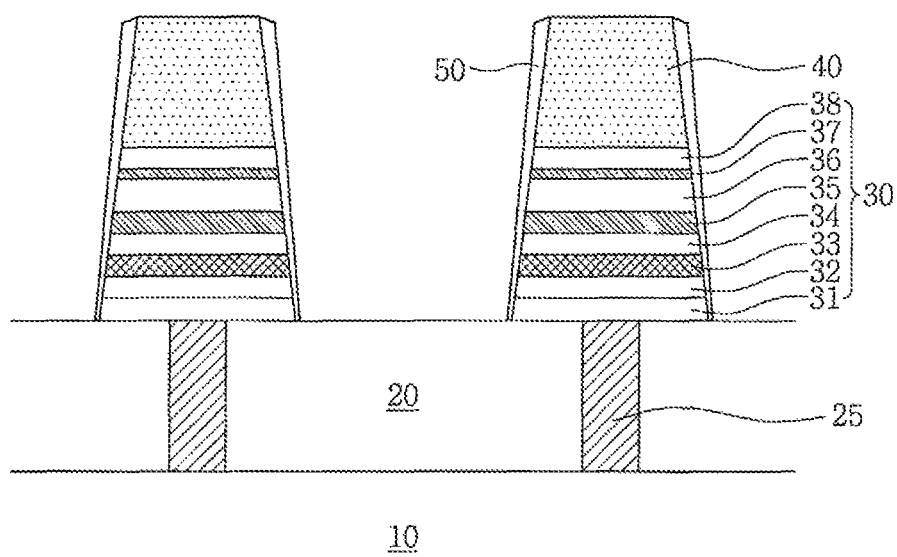

Referring to FIGS. 1 and 2C, the method may include patterning the magneto tunnel layers 30a to form a magnetic tunnel junction (MTJ) 30 by performing an etching process using the hard mask 40 as an etching mask (S30). The MTJ 30 may include the seed layer 31, the lower fixed magneto layer 32, the SAF layer 33, the upper fixed magneto layer 34, the lower tunneling barrier layer 35, the free layer 36, the upper tunneling barrier layer 37, and the capping layer 38 which are etched. For example, the etching process may include an ion beam sputtering etching process using argon plasma. The hard mask 40 may be thinned. Etching by-products 50 may be formed on side surfaces of the MTJ 30 and side surfaces of the hard mask 40. The etching by-products 50 may mainly include a metal included in the hard mask 40 such as tungsten (W) or titanium (Ti). The etching by-products 50 may be formed more thickly on an upper portion of a sidewall of the MTJ 30 than on a lower portion of the sidewall.

Figure 2D:
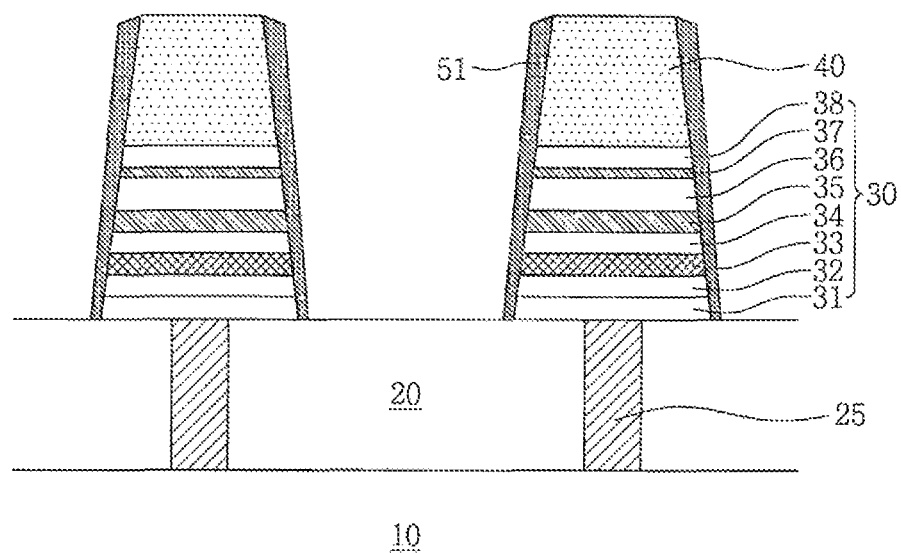

Referring to FIGS. 1 and 2D, the method may include separating a portion of the MTJ 30 or gathering a sample MTJ 30 for inspection to provide a specimen for inspection (S40), and performing chemical treatment on the specimen for inspection to change the etching by-products 50 into a visible chemical reactant 51 (S50). In particular, the method may include inducing a chemical reaction of the etching by-products 50 of the specimen for inspection with a chemical mixture of an organic solvent and amine. The chemical may include the organic solvent at about 45 to 54 Vol %, $NH_2$—$NH_2$ at about 45 to 54 Vol %, and water ($H_2O$) at about 0 to 1 Vol %. When the etching by-products 50 include tungsten (W), the chemical treatment may be described by the following reaction formula.

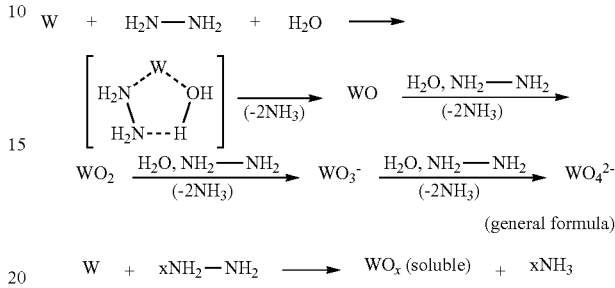

(general formula)

The tungsten oxide ($WO_x$) may be dissolved in the organic solvent.

Alternatively, the method may include performing chemical treatment on the substrate 10 for inspection on which the specimen for inspection, that is the etching by-products 50, is formed, with a chemical including an organic solvent including any one of ammonia, ethanol, propanol, hexane, diethylether, isopropyl alcohol, tetrahydrofuran, and acetone, $NH_2OH$, and water ($H_2O$). The chemical may include the organic solvent at about 45 to 54 Vol %, the $NH_2OH$ at about 45 to 54 Vol %, and water ($H_2O$) at about 0 to 1 Vol %. When the etching by-products 50 include tungsten (W), the chemical treatment may be described by the following reaction formula.

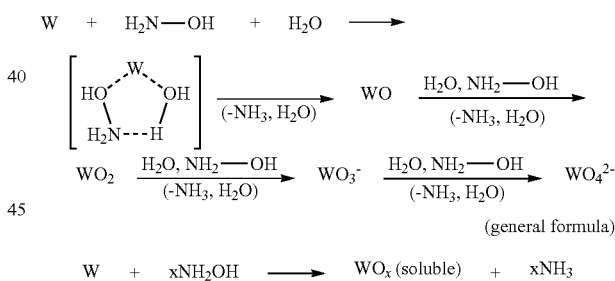

(general formula)

In some embodiments, when the etching by-products 50 include titanium nitride (TiN), the method may include performing chemical treatment on the substrate 10 for inspection on which the specimen for inspection, that is the etching by-products 50, is formed, using a chemical including $NH_2$—$NH_2$ and water ($H_2O$), or a chemical including $NH_2OH$ and water ($H_2O$). The $NH_2$—$NH_2$, $NH_2OH$, and water (HO) may donate a base (—OH) to titanium nitride (TiN). For example, bases (—OH) of 3 moles or more are donated to titanium nitride (TiN) of one mole to form titanium oxide (TiO). For example, the chemical may include the organic solvent at about 45 to 54 Vol %, the $NH_2$—$NH_2$ or $NH_2HO$ at about 45 to 54 Vol %, and water ($H_2O$) at about 0 to 1 Vol %. The organic solvent may include any one of ammonia, ethanol, propanol, hexane, diethylether, isopropyl alcohol, tetrahydrofuran, and acetone. The chemical treatment may be described by the following reaction formula.

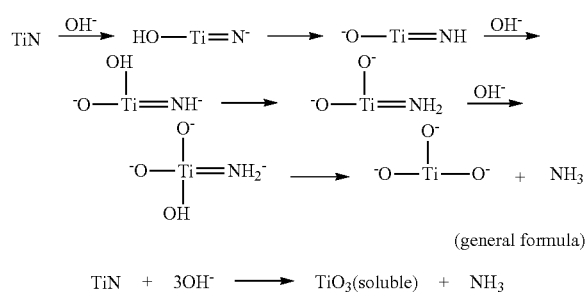

(general formula)

TiN + 3OH⁻ ⟶ TiO₃(soluble) + NH₃

The titanium oxide (TiO₃) may be dissolved in the organic solvent.

The chemical treatment may include a wet oxidation process. Thus, the chemical reactant 51 may include materials wet oxidized from the etching by-products 50. The chemical reactant 51 may have a volume greater than that of the etching by-products 50. That is, the volume of the etching by-products 50 may be increased through the chemical treatment.

The method may include inspecting and analyzing the chemical reactant 51 with an electron microscope using transmission electron microscopy (TEM) (S60). Since the etching by-products 50 cannot easily be identified visually using conventional TEM, the etching by-products 50 may require analysis using a complex analyzing method such as TEM energy dispersive X-ray spectroscopy (TEM EDX). However, the chemical reactant 51 in accordance with the inventive concept may readily be identified visually and analyzed using conventional TEM. Based on qualitative and quantitative analysis of the chemical reactant 51 using conventional TEM, the process for manufacturing the semiconductor device may be evaluated, and wherein process conditions may be adjusted, corrected and revised with less degradation in productivity in the manufacturing process. In particular, based on inspection analysis of the chemical reactant 51, various process conditions such as types and thickness of the hard mask 40, process performance time, amount of gas flow, ion density, plasma source power, bias power, and sputtering pressure of the etching process may be adjusted, corrected and compensated.

Figure 2E:
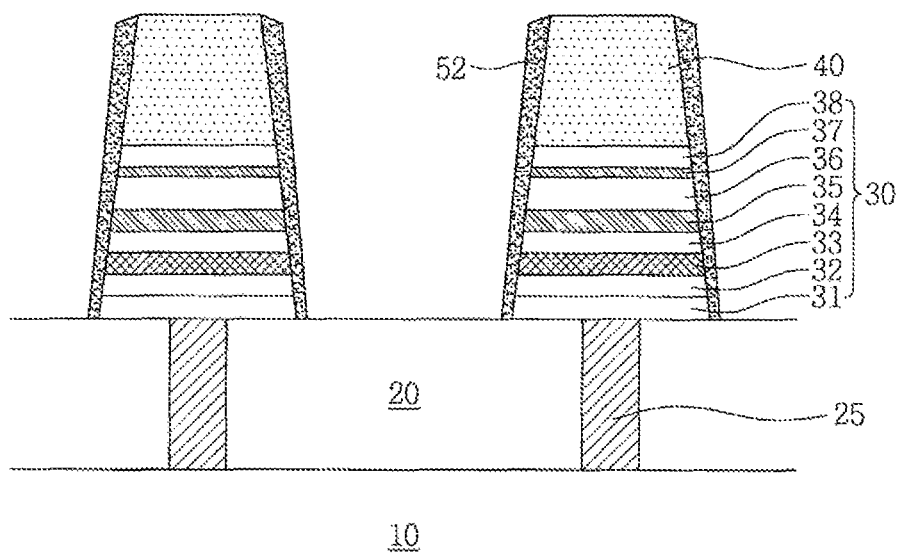

Referring to FIGS. 1 and 2E, the method may include oxidizing the etching by-products 50 by performing an oxidizing process with further reference to FIG. 2C (S70). For example, the etching by-products 50 may be dry oxidized by oxygen (O₂) gas in a chamber. The process conditions of the oxidizing process may be set, corrected, or compensated based on the analysis result of the chemical reactant 51.

Figure 2F:
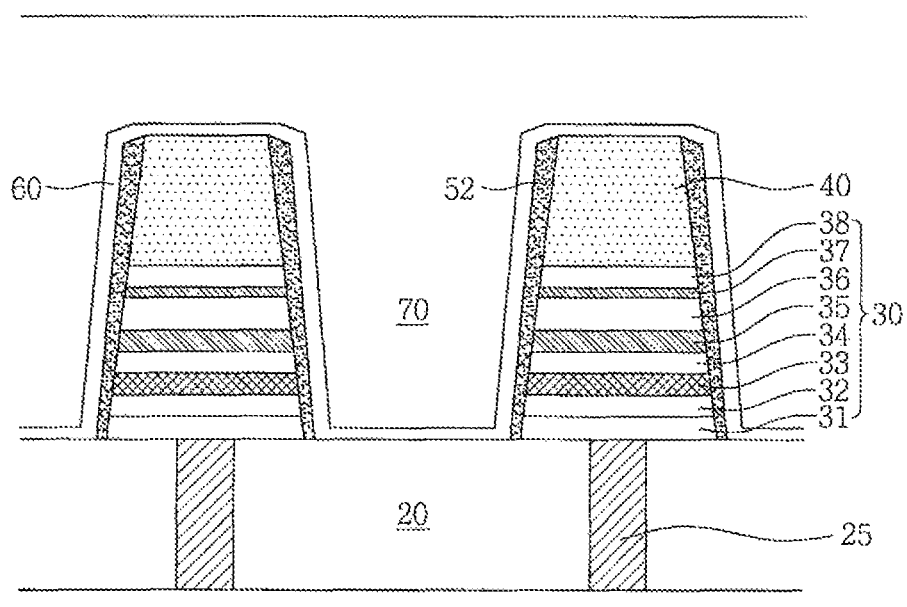

Referring to FIGS. 1 and 2F, the method may include conformally forming a liner layer 60 on surfaces of the MTJ 30, the hard mask 40, and the lower interlayer insulating layer 20, and forming an upper interlayer insulating layer 70 on the liner layer 60 (S80). For example, the liner layer 60 may be conformally formed on etching by-products 52 oxidized on the side surfaces of the MTJ 30 and the hard mask 40. The liner layer 60 may include any one of aluminum oxide (Al₂O₃), silicon nitride (SiN), silicon oxynitride SiON, and silicon carbide nitride (SiCN). The upper interlayer insulating layer 70 may include silicon oxide.

Figure 2G:
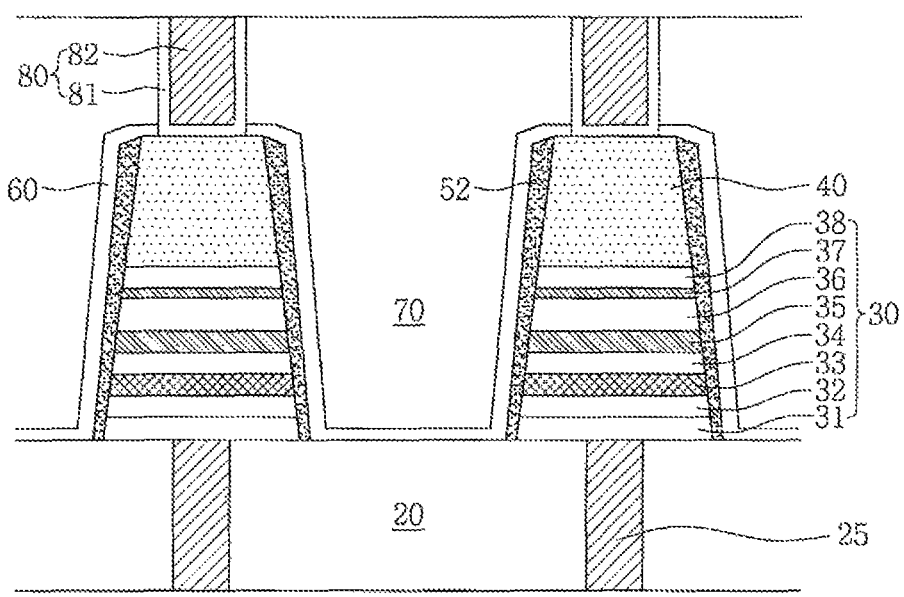

Referring to FIGS. 1 and 2G, the method may include forming a hole which passes through the upper interlayer insulating layer 70 and the liner layer 60 and exposes the hard mask 40, and forming an upper electrode 80 in the hole (S90). The upper electrode 80 may include an electrode barrier layer 81 formed on inner walls of the hole and an exposed portion of the hard mask 40, and an electrode plug 82 formed on the electrode barrier layer 81. The electrode barrier layer 81 may include titanium nitride (TiN) or tantalum nitride (TaN). The electrode plug 82 may include a metal such as tungsten (W). The method may include a planarization process such as a chemical mechanical polishing (CMP) process, and thus, upper surfaces of the upper electrode 80 and the upper interlayer insulating layer 70 may be formed to be coplanar.

Figure 2H:
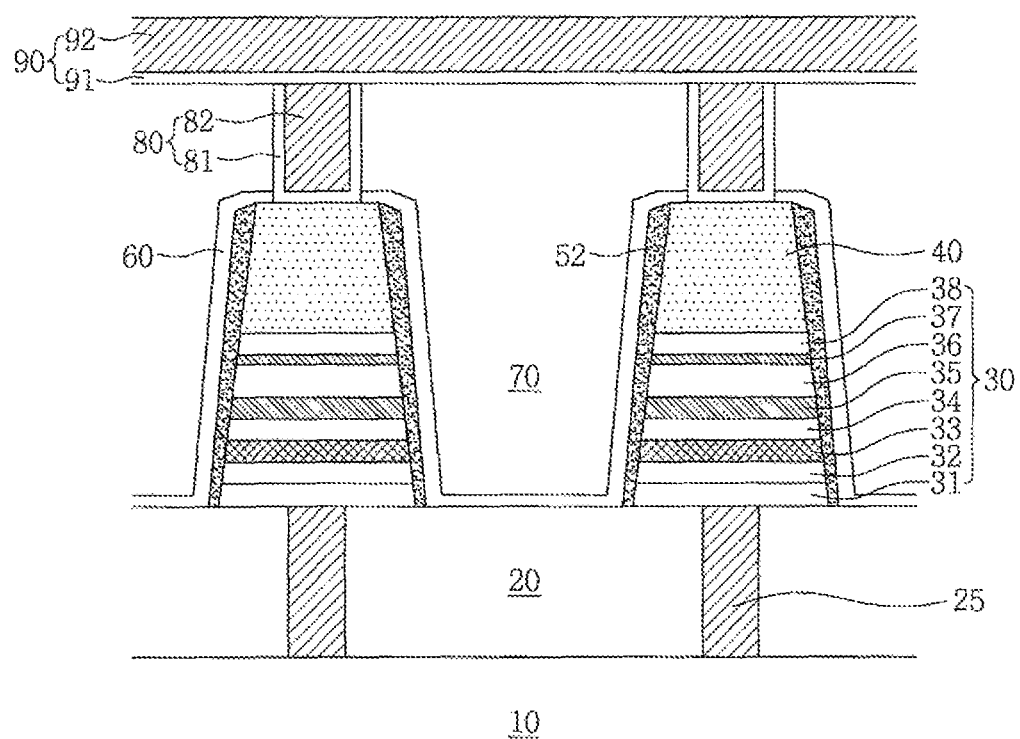

Referring to FIGS. 1 and 2H, the method may include forming a bit line 90 on an upper surfaces of the upper electrode 80 and the upper interlayer insulating layer 70 (S100). The bit line 90 may include a bit line barrier layer 91 and a bit line wire 92. The bit line barrier layer 91 may include titanium nitride (TiN) or tantalum nitride (TaN). The bit line wire 92 may include a metal such as tungsten (W). Then, the method may include performing a subsequent process including forming an insulating material layer on the bit line 90 (S110).

Figure 3:
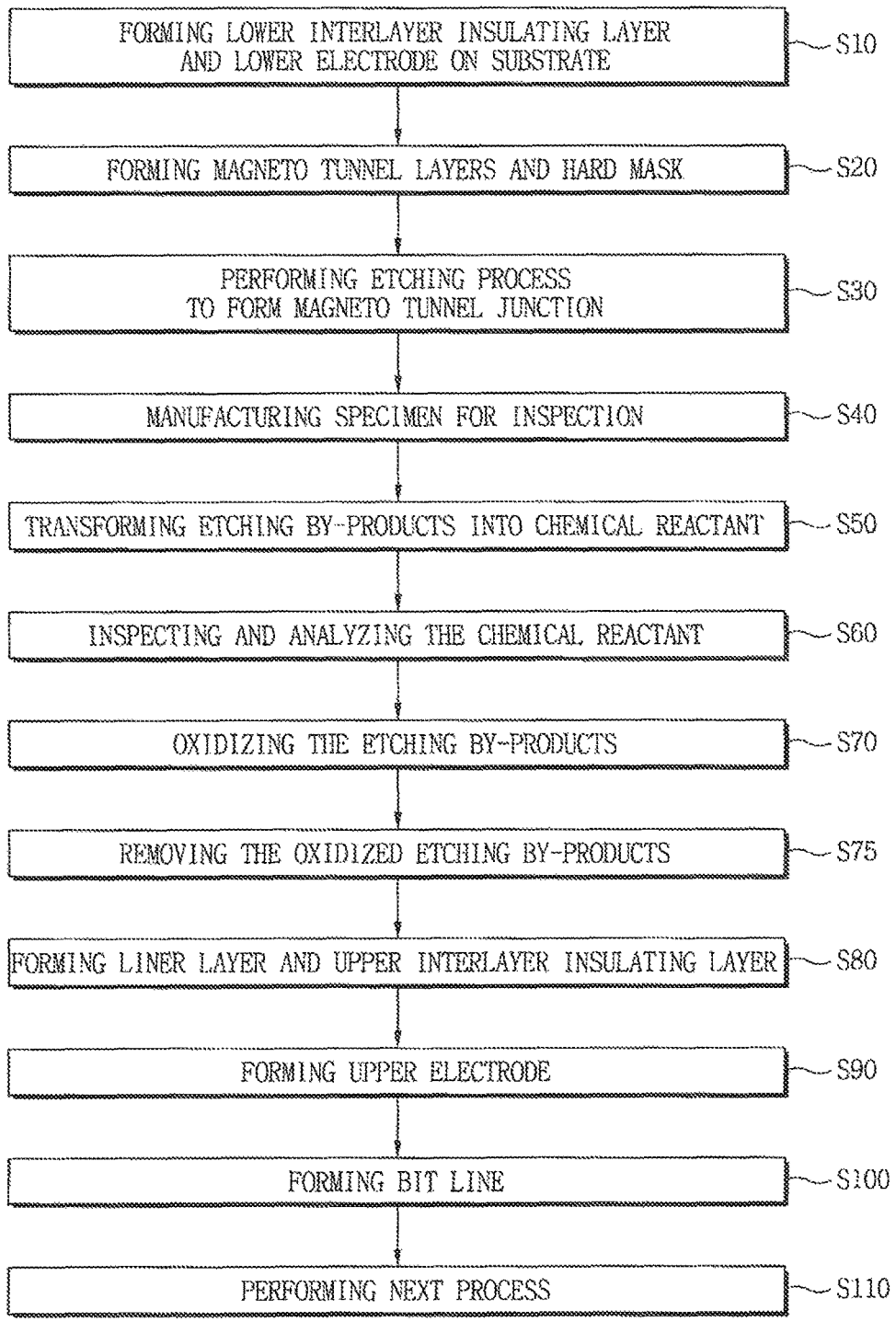
FIG. 3 is a flowchart illustrating a method of manufacturing a semiconductor device in accordance with an embodiment of the inventive concept.
Figure 4A:
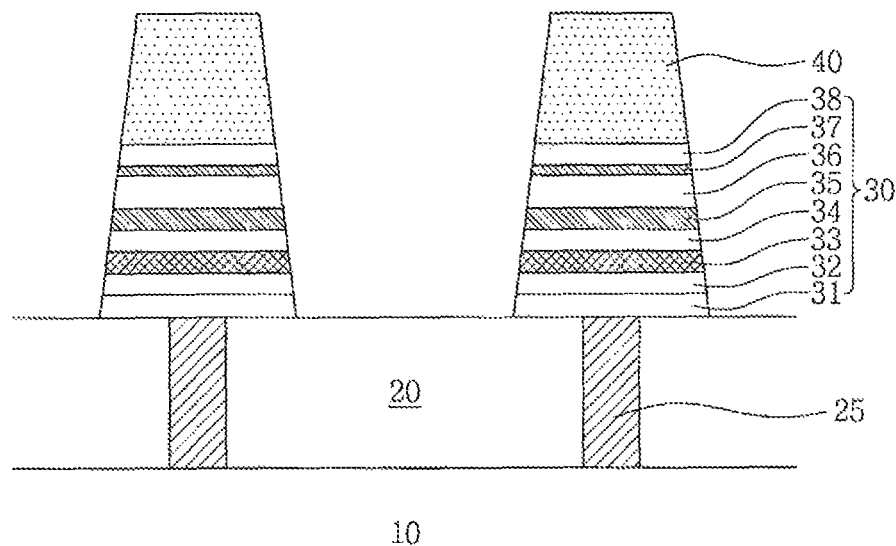
FIGS. 4A to 4C are longitudinal cross-sectional views illustrating a semiconductor device for schematically describing a method of manufacturing a semiconductor device in accordance with an embodiment of the inventive concept.
Figure 4B:
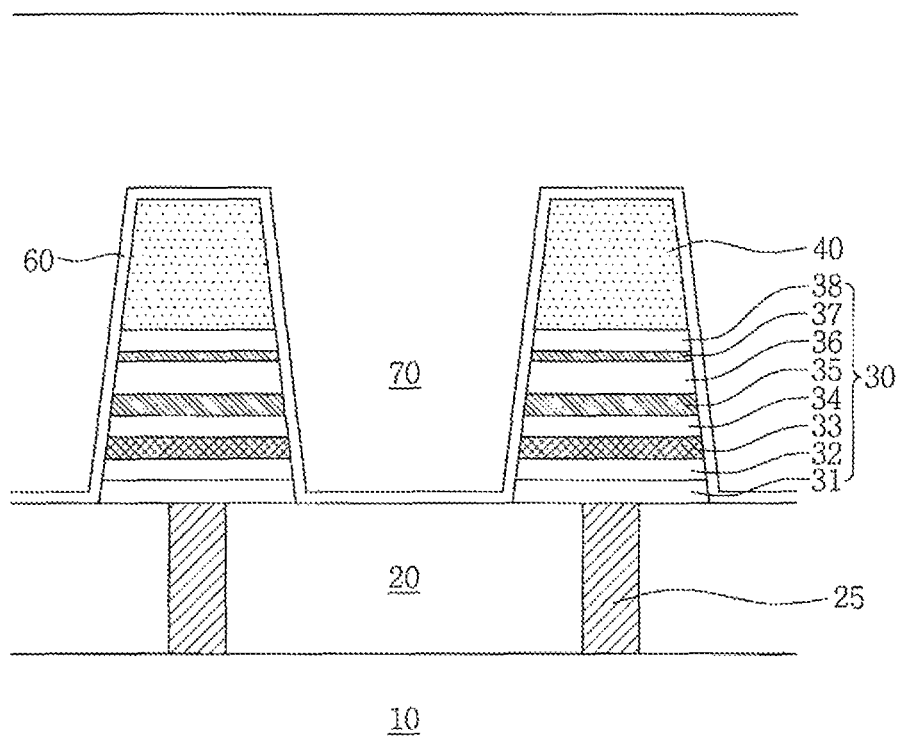
Figure 4C:
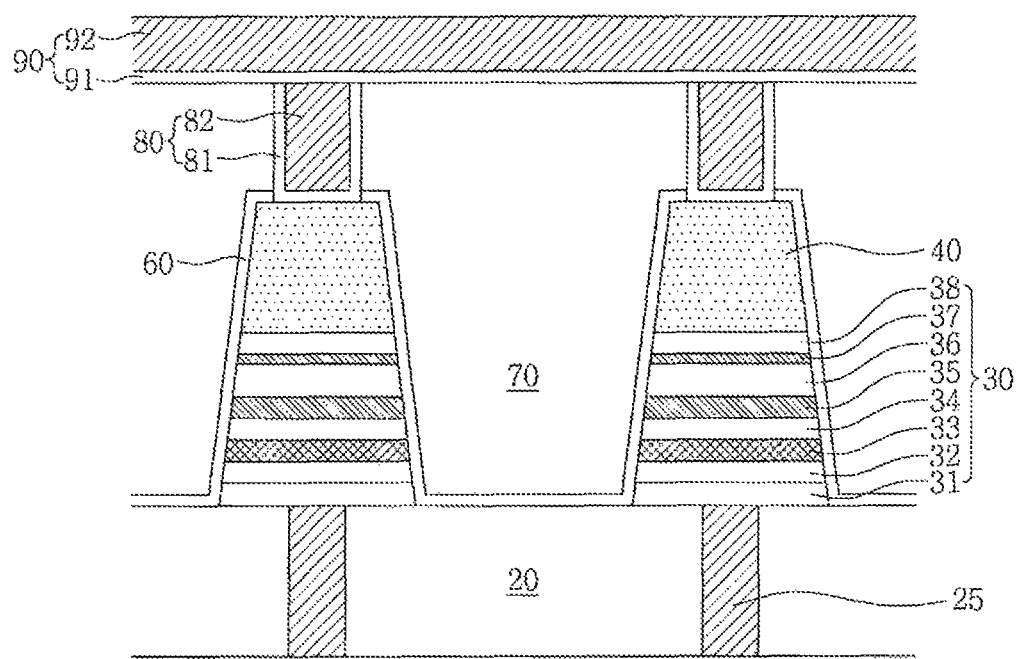

FIG. 3 is a flowchart illustrating a method of manufacturing a semiconductor device in accordance with an embodiment of the inventive concept, and FIGS. 4A to 4C are longitudinal cross-sectional views illustrating a semiconductor device for schematically describing a method of manufacturing a semiconductor device in accordance with an embodiment of the inventive concept.

In the method of manufacturing the semiconductor device in accordance with the embodiment of the inventive concept, first, the processes described with reference to FIGS. 3, 2A to 2D or 2E are performed, and a lower interlayer insulating layer 20 and a lower electrode 25 are formed on a substrate 10 (S10), magneto tunnel layers 30a and a hard mask 40 are formed on the lower interlayer insulating layer 20 and the lower electrode 25 (S20), an etching process is performed to form an MTJ 30, wherein etching by-products 50 are formed on side surfaces of the MTJ 30 and the hard mask 40 (S30), a manufacturing specimen for inspection is manufactured (S40), a chemical treatment is performed on the specimen on the inspection to convert the etching by-products 50 into chemical reactants 51 (S50), the chemical reactants 51 are inspected and analyzed using an electron microscope such as TEM (S60), and the etching by-products 50 are oxidized (S70). In another embodiment of the inventive concept, the oxidization of the etching by-products 50 (S70) may be omitted.

Referring to FIGS. 3 and 4A, the method may include performing a trimming process to remove the oxidized etching by-products 52 (S75). In another embodiment of the inventive concept, the method may include performing a trimming process to remove the etching by-products 50. The trimming process may include chemically removing a portion or all of the oxidized etching by-products 52 or the etching by-products 50 using a gas including an element of the halogen group such as fluorine (F), chlorine (Cl), bromine (Br). In the embodiment of the inventive concept, in order to easily understand the inventive concept, it is assumed and described that the oxidized etching by-products 52 or the etching by-products 50 may be completely removed. The method may include cleaning the remaining oxidized etching by-products 52 or the remaining etching by-products 50, or the MTJ 30 using an organic solvent, and/or the like. The organic solvent may include any one of ammonia, ethanol, propanol, hexane, diethylether, isopropyl alcohol, tetrahydrofuran, and acetone.

Referring to FIGS. 3 and 4B, the method may include conformally forming a liner layer 60 on surfaces of the MTJ 30, the hard mask 40, and the lower interlayer insulating layer 20, and forming an upper interlayer insulating layer 70 on the liner layer 60.

Referring to FIGS. 3 and 4C, the method may include forming an upper electrode 80 and a bit line 90. Other components which are not described may be understood with reference to FIGS. 2A to 2H.

According to the inventive concept, a degree of forming etching by-products including tungsten (W) or titanium (Ti) may be evaluated in a method of manufacturing a semiconductor device.

According to the inventive concept, the etching by-products including tungsten (W) or titanium (Ti) generated in the method of manufacturing the semiconductor device may be evaluated and process conditions may be optimized.

According to the inventive concept, since metallic etching by-products generated in the method of manufacturing the semiconductor device may be optically identified using an electron microscope such as a TEM, a time required for the inspection may be decreased.

Other various effects have been described in the specification.

Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A method of manufacturing a semiconductor device, comprising:
    forming magneto tunnel layers;
    forming a hard mask on the magneto tunnel layers;
    etching the magneto tunnel layers to form a magneto tunnel junction;
    performing a chemical treatment on a specimen for inspection from the magneto tunnel junction to convert etching by-products formed on sidewalls of the specimen into a chemical reactant; and
    inspecting the chemical reactant.

2. The method of claim 1, wherein the magneto tunnel junction comprises a seed layer, a lower fixed magneto layer, a synthetic anti-ferromagnetic layer, an upper fixed magneto layer, a lower tunneling barrier layer, a free layer, an upper tunneling barrier layer, and a capping layer.

3. The method of claim 2, wherein:
    the lower tunneling barrier layer comprises magnesium oxide (MgO); and
    the upper tunneling barrier layer comprises one selected from the group of magnesium oxide (MgO), tantalum oxide (TaO), titanium oxide (TiO), barium oxide (BaO), zirconium oxide (ZrO), aluminum oxide (AlO), strontium oxide (SrO), hafnium oxide (HfO), lanthanum oxide (LaO), cerium oxide (CeO), samarium oxide (SmO), thorium oxide (ThO), calcium oxide (CaO), scandium oxide (ScO), yttrium oxide (YO), chrome oxide (CrO), tungsten oxide (WO), and an oxide of another metal.

4. The method of claim 1, wherein the hard mask comprises any one selected from the group consisting of tungsten (W) and titanium nitride (TiN).

5. The method of claim 1, wherein:
    the etching by-products mainly comprise any one selected from the group consisting of tungsten (W) and titanium (Ti); and
    the chemical reactant mainly comprises any one selected from the group consisting of tungsten oxide ($WO_x$) and titanium oxide ($TiO_3$).

6. The method of claim 1, wherein the chemical treatment uses a chemical mixed with an organic solvent, amine, and water.

7. The method of claim 6, wherein the organic solvent comprises one selected from the group consisting of ammonia, ethanol, propanol, hexane, diethylether, isopropyl alcohol, tetrahydrofuran, and acetone.

8. The method of claim 6, wherein the amine comprises one selected from the group consisting of $NH_2$—$NH_2$ and $NH_2OH$.

9. The method of claim 6, wherein the chemical comprises the organic solvent at 45 to 54 Vol %, the amine at 45 to 54 Vol %, and water at 1 Vol % or less.

10. The method of claim 1, wherein the inspecting of the chemical reactant comprises optically inspecting the chemical reactant using transmission electron microscopy (TEM).

11. A method of manufacturing a semiconductor device, comprising:
    forming an insulating layer on a substrate;
    forming a magneto tunnel junction and a hard mask on the insulating layer; performing a chemical treatment on a specimen for inspection from the magneto tunnel junction to convert etching by-products formed on sidewalls of the specimen into a chemical reactant; and
    inspecting the chemical reactant; and
    correcting conditions for forming the magneto tunnel junction.

12. The method of claim 11, wherein the forming of the magneto tunnel junction comprises performing ion beam sputtering using argon plasma.

13. The method of claim 12, wherein the correcting of the conditions comprises correcting at least one selected from the group consisting of amount of gas flow, ion density, plasma source power, plasma bias power, sputtering pressure, temperature, and process performance time of the ion beam sputtering process.

14. The method of claim 11, further comprising:
    oxidizing the etching by-products formed on the sidewalls of the magneto tunnel junction; and
    removing at least a portion of the oxidized etching by-products.

15. The method of claim 11, further comprising cleaning the magneto tunnel junction using an organic solvent.

16. A method for forming a magneto tunnel junction for a semiconductor device comprising:
    forming magneto tunnel layers on an insulating layer formed on a substrate;
    forming a hard mask on the magneto tunnel layers;
    etching the magneto tunnel layers to form a magneto tunnel junction;
    performing a chemical treatment on a specimen for inspection from the magneto tunnel junction to convert etching by-products formed on sidewalls of the specimen for inspection into a chemical reactant;
    inspecting the chemical reactant; and
    removing etching by-products formed on sidewalls of the magneto tunnel junction and the hard mask.

17. The method of claim 16, further comprising:
    oxidizing the etching by-products formed on the sidewalls of the magneto tunnel junction and hard mask; and removing at least a portion of the oxidized etching by-products.

18. The method of claim 16, wherein all of the etching by-products are removed.

19. The method of claim 16, wherein the etching by-products are chemically removed using a gas.

20. The method of claim 18, wherein the gas comprises an element of the halogen group.

* * * * *